United States Patent
Wu et al.

(10) Patent No.: US 6,329,244 B1
(45) Date of Patent: Dec. 11, 2001

(54) METHOD OF MANUFACTURING DYNAMIC RANDOM ACCESS MEMORY CELL

(75) Inventors: King-Lung Wu, Tainan Hsien; Kun-Chi Lin, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/734,838

(22) Filed: Dec. 11, 2000

(30) Foreign Application Priority Data

Dec. 4, 2000 (TW) .............................. 89125786 A

(51) Int. Cl.⁷ .............................. H01L 21/8242
(52) U.S. Cl. .................. 438/256; 438/253; 438/396; 438/399
(58) Field of Search .................. 438/253, 256, 438/396, 399

(56) References Cited

U.S. PATENT DOCUMENTS

| | | | |
|---|---|---|---|
| 6,074,955 | * 6/2000 | Lin et al. | 438/710 |
| 6,150,213 | * 11/2000 | Luo et al. | 438/253 |
| 6,174,782 | * 1/2001 | Lee | 438/396 |

* cited by examiner

Primary Examiner—Richard Elms
Assistant Examiner—Beth E. Owens
(74) Attorney, Agent, or Firm—Thomas, Kayden, Horstemeyer & Risley

(57) ABSTRACT

A method of manufacturing a dynamic random access memory cell. A substrate having a transistor therein is provided. A first dielectric layer is formed over the substrate and the transistor. A bit line having a cap layer thereon is formed over the first dielectric layer. A protective layer is formed over the substrate covering the bit line. A second dielectric layer is formed over the protective layer. The second dielectric layer is etched in a self-aligned process. The etching continues penetrating the protective layer and the first dielectric layer until the substrate is exposed so that a node contact opening and an opening for forming the lower electrode of a capacitor are formed at the same time. Thereafter, polysilicon material is deposited into the node contact opening and the lower electrode opening to form a polysilicon layer. The upper surface of the polysilicon layer is slightly below the lower electrode opening. A spacer is formed on the sidewalls of the lower electrode opening above the polysilicon layer. Using the spacers as a mask, the polysilicon layer is etched to form a lower electrode with a recess groove above the node contact opening. The second dielectric layer and the spacers are removed. To complete the fabrication of the DRAM cell capacitor, a dielectric layer is formed over the lower electrode and an upper electrode is formed over the dielectric layer.

18 Claims, 5 Drawing Sheets

300

METHOD OF MANUFACTURING DYNAMIC RANDOM ACCESS MEMORY CELL

CROSS-REFERENCE TO RELATED APPLICATION

This application claims the priority benefit of Taiwan application serial no. 89125786, filed Dec. 4, 2000.

BACKGROUND OF THE INVENTION

1. Field of Invention

The present invention relates to a method of manufacturing a semiconductor device. More particularly, the present invention relates to a method of manufacturing dynamic random access memory (DRAM) cell.

2. Description of Related Art

Dynamic random access memory (DRAM) is a type of volatile memory. Although reading from and writing to a DRAM cell is quite complicated and the design of peripheral circuits is quite intricate, each DRAM cell consists only of a transistor and capacitor. Hence, an array of the device can be put together on a silicon chip to produce a highly integrated memory circuit at a low cost. Nowadays, DRAM is one of the most widely adopted memory components.

A capacitor is a critical device in the storage of data in each DRAM cell. A DRAM capacitor capable of storing a larger number of electric charges is less vulnerable to noise corruption when stored data within the DRAM is read out. There are a number of means to increase the storage capacity of a capacitor. For example, the effective surface area of a capacitor can be increased to provide more space for accumulating electric charges. However, as the level of integration continues to increase, new methods and structures must be sought to obtain a relatively constant capacitance.

FIGS. 1A through 1E are schematic cross-sectional views showing the progression of steps for manufacturing a conventional DRAM cell.

As shown in FIG. 1A, a substrate 100 having a transistor therein is provided. A first dielectric layer 101 is formed over the substrate 100 and then a bit line 103 is formed over the first dielectric layer 101. A second dielectric layer 102 is formed over the bit line 103 and the first dielectric layer 101. Using photolithographic technique, a patterned first photoresist layer 104 is formed over the second dielectric layer 102.

As shown in FIG. 1B, a node contact opening 106 is formed in the second dielectric layer 102 using the first photoresist layer 104 as an etching mask. The first photoresist layer 104 is removed. Polysilicon material is deposited into the node contact opening 106 to form a polysilicon layer 108. A silicon nitride layer 110 is formed over the second dielectric layer 102 and then a third dielectric layer 112 is formed over the silicon nitride layer 110. A second patterned photoresist layer 114 is formed over the third dielectric layer 112.

As shown in FIG. 1C, the second dielectric layer 112 and the silicon nitride layer 110 are sequentially etched using the second patterned photoresist layer 114 as a mask to form an opening 116. The second photoresist layer 114 is removed. Polysilicon material is deposited into the opening 116 and over the second dielectric layer 112 to form a polysilicon layer 118. A silicon oxide layer 120 that fills the opening 116 is formed over the polysilicon layer 118.

As shown in FIG. 1D, the silicon oxide layer 120 is etched back until the polysilicon layer 118 is exposed. The polysilicon layer 118 is etched until the third dielectric layer 112 is exposed.

As shown in FIG. 1E, the third dielectric layer 112 and the silicon oxide layer 120 are removed using the silicon nitride layer 110 as an etching stop layer. Ultimately, the polysilicon layer 108 at the bottom section of the opening 116 is exposed to serve as the lower electrode of a capacitor.

In a conventional method, the process of forming the node contact and the lower electrode opening requires two masking steps. The additional process not only increases production cost, the chance of contaminating the silicon chip increases as well. Moreover, the process of forming the node contact opening requires proper alignment. Any misalignment may lead to circuit connection errors.

SUMMARY OF THE INVENTION

Accordingly, one object of the present invention is to provide a method of manufacturing a dynamic random access memory (DRAM) cell that reduces the number of masking steps and hence reduces possibility of contamination and lowers production cost. Furthermore, the method can prevent circuit connection problems due to node contact opening misalignment.

To achieve these and other advantages and in accordance with the purpose of the invention, as embodied and broadly described herein, the invention provides a method of manufacturing a dynamic random access memory cell. A substrate having a transistor therein is provided. A first dielectric layer is formed over the substrate and the transistor. A bit line having a cap layer thereon is formed over the first dielectric layer. A protective layer is formed over the substrate covering the bit line. A second dielectric layer is formed over the protective layer. The second dielectric layer is etched in a self-aligned process. The etching continues penetrating the protective layer and the first dielectric layer until the substrate is exposed so that a node contact opening and an opening for forming the lower electrode of a capacitor are formed at the same time. Thereafter, polysilicon material is deposited into the node contact opening and the lower electrode opening to form a polysilicon layer. The upper surface of the polysilicon layer is slightly below the lower electrode opening. A spacer is formed on the sidewalls of the lower electrode opening above the polysilicon layer. Using the spacers as a mask, the polysilicon layer is etched to form a lower electrode with a recess groove above the node contact opening. The second dielectric layer and the spacers are removed. To complete the fabrication of the DRAM cell capacitor, a dielectric layer is formed over the lower electrode and then an upper electrode is formed over the dielectric layer.

In this invention, since a self-aligned method is used to form the node contact opening, the application of mask and photoresist is not required. Therefore, the number of processing steps and hence production cost and time are reduced. In addition, the chance of contaminating the device is minimized. Moreover, there is no need to worry about contact opening misalignment because a self-aligned process is used. Hence, tolerance for the fabrication process is improved. Furthermore, the space between the bit lines is utilized to form part of the lower electrode and hence effective surface area of the capacitor is increased. Another advantage of using the space between the bit lines as part of the lower electrode is that capacitor height can be reduced. In brief, the invention is able to increase the effective surface of a capacitor. Ultimately, the level of integration can be increased without compromising charge storage capacity of the capacitor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
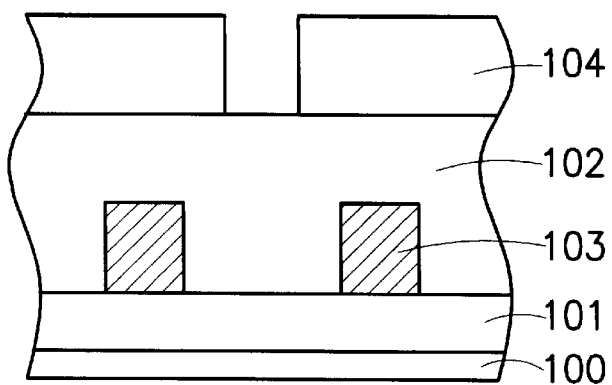
FIGS. 1A through 1E are schematic cross-sectional views showing the progression of steps for manufacturing a conventional DRAM cell.
Figure 1B:
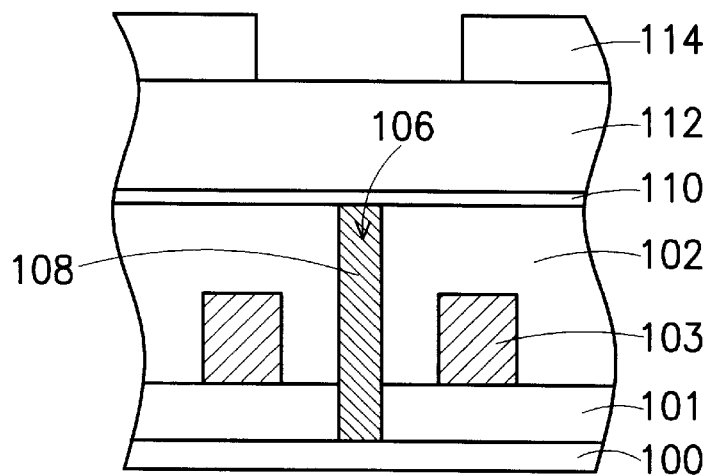
Figure 1C:
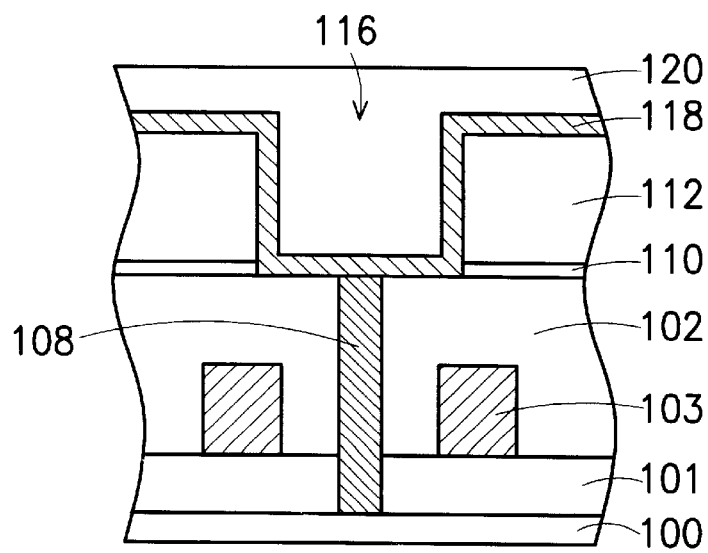
Figure 1D:
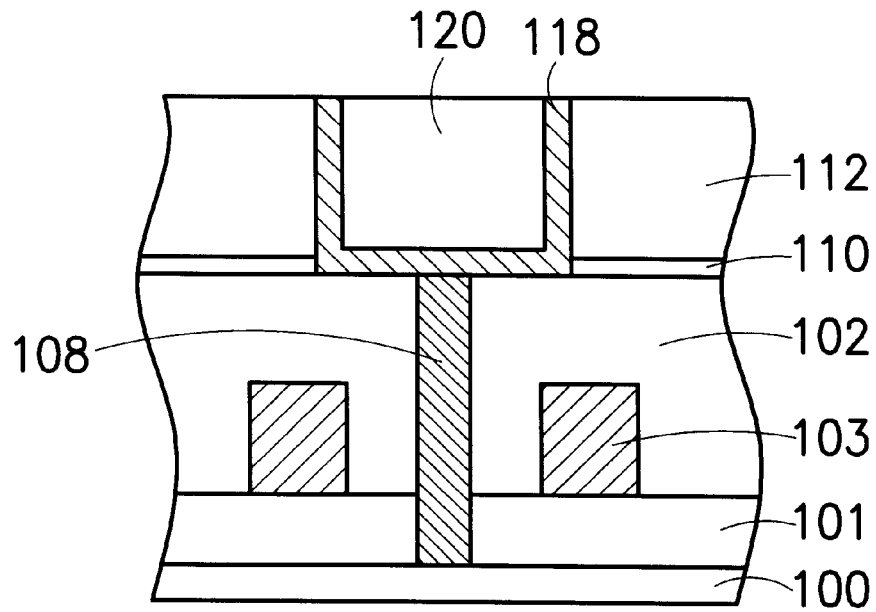
Figure 1E:
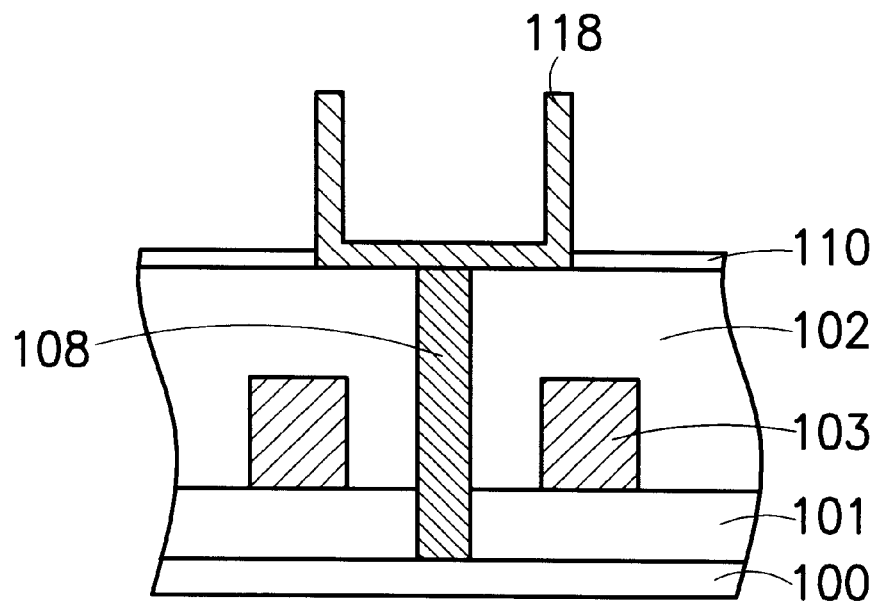

Reference will now be made in detail to the present preferred embodiments of the invention, examples of which are illustrated in the accompanying drawings. Wherever possible, the same reference numbers are used in the drawings and the description to refer to the same or like parts.

Figure 2A:
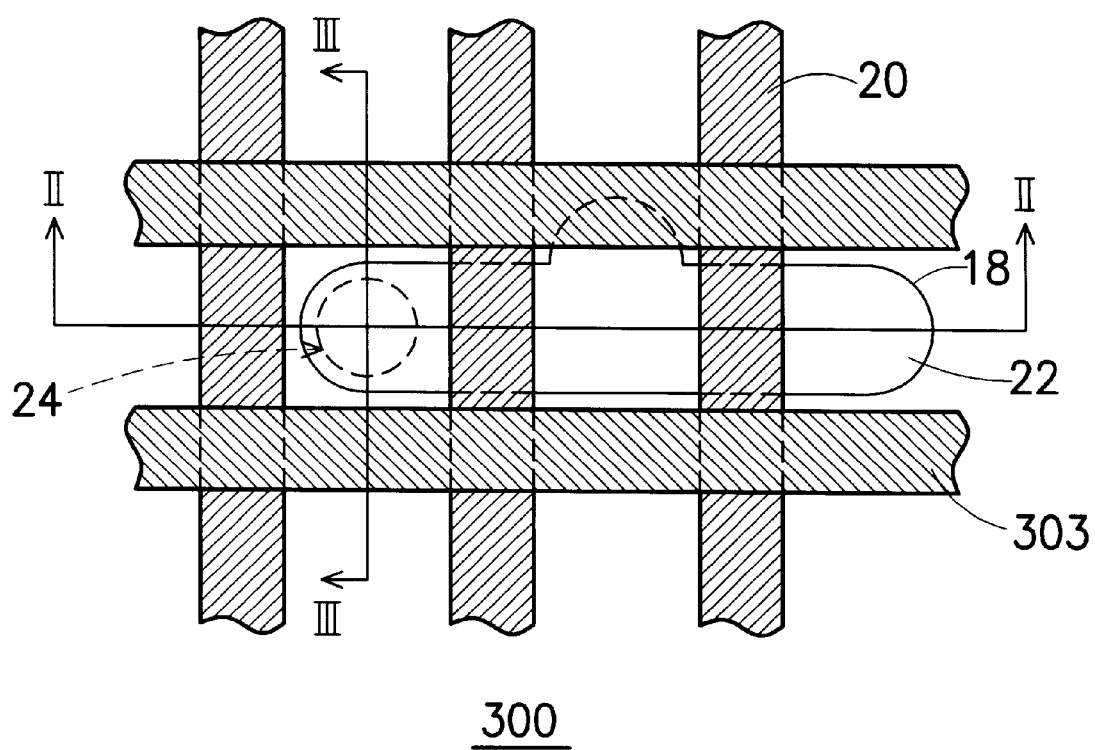
FIG. 2A is a top view showing a portion of a dynamic random access memory (DRAM) according to one preferred embodiment of this invention.
Figure 2B:
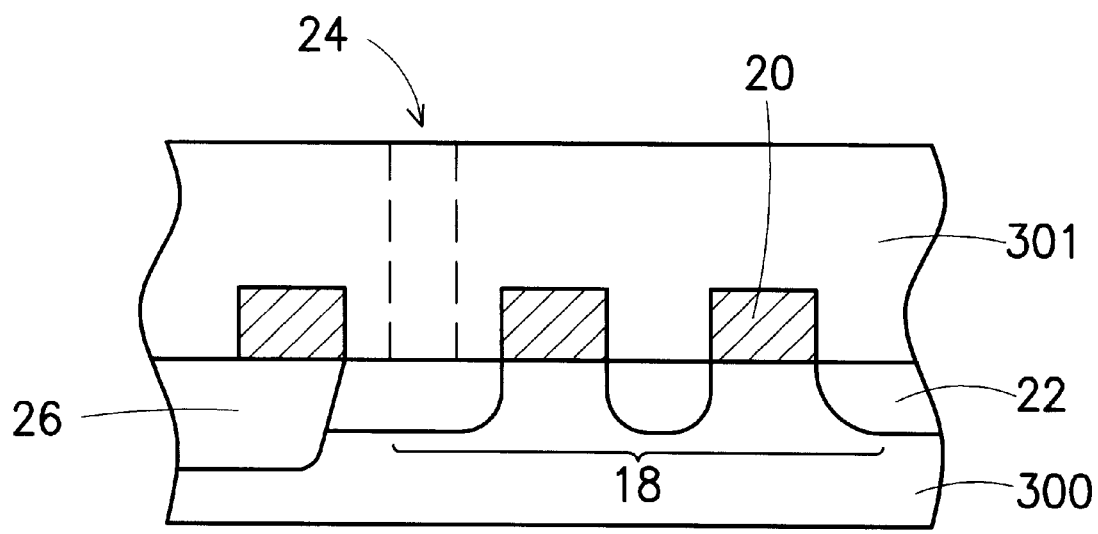
FIG. 2B is a cross-sectional view along line II—II of FIG. 2A.

FIG. 2A is a top view showing a portion of a dynamic random access memory (DRAM) according to one preferred embodiment of this invention. FIG. 2B is a cross-sectional view along line II—II of FIG. 2A.

As shown in FIGS. 2A and 2B, a semiconductor substrate 300 is provided. The semiconductor substrate 300 has an active region 18 marked out by isolation structures 26. A plurality of gate lines serving as DRAM word lines 20 and source/drain terminals 22 are formed on the substrate 300. A dielectric layer 301 is formed over the word lines 20 and the substrate 300. A plurality of bit lines 303 is formed over the dielectric layer 301. The bit lines 303 are perpendicular to the word lines 20. Area 24 for forming the DRAM capacitor is located between the bit lines 303 and the word lines 20 above one of the source/drain terminals 22.

FIGS. 3A through 3F are cross-sectional views showing the progression of steps for producing a DRAM capacitor, where the sectioning runs along line III—III of FIG. 2A.

Figure 3A:
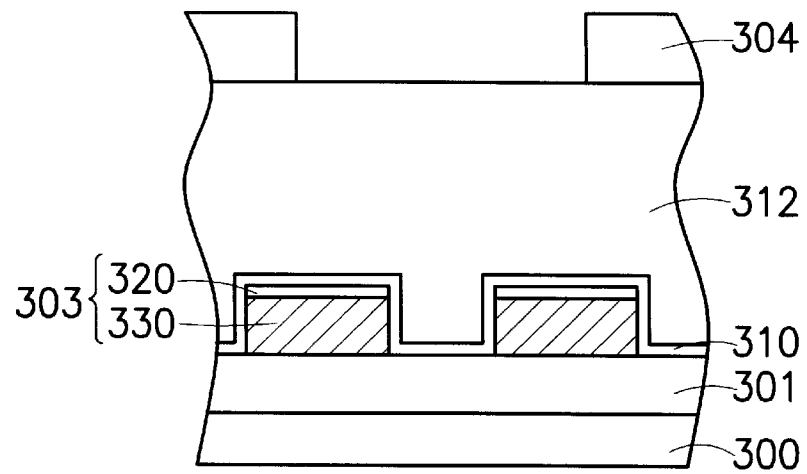
FIGS. 3A through 3F are cross-sectional views showing the progression of steps for producing a DRAM capacitor, where the sectioning runs along line III—III of FIG. 2A.

As shown in FIG. 3A, a substrate 300 having a transistor therein is provided. A first dielectric layer 301 is formed over the substrate 300 and the transistor. A bit line 303 comprising of a cap layer 320 on top of a conductive layer 330 is formed over the first dielectric layer 301. The conductive layer 330 can be a composite layer that includes a polysilicon layer and a silicide layer. The polysilicon layer is formed by low-pressure chemical vapor deposition and the silicide layer can be a tungsten silicide layer formed by chemical vapor deposition or physical vapor deposition, for example. The cap layer 320 can be a silicon nitride layer formed, for example, by low-pressure chemical vapor deposition. A protective layer 310 is formed over the first dielectric layer 301 covering the bit lines 303. The protective layer 310 has an etching rate that differs considerably from the first dielectric layer 301 and a subsequently formed second dielectric layer 312. Preferably, the protective layer 310 is a silicon nitride layer having a thickness about 300 Å. A second dielectric layer 312 is formed over the protective layer 310. The second dielectric layer 312 can be a silicon oxide layer having a thickness about 8000 Å. A patterned photoresist layer 304 is formed over the second dielectric layer 310.

Figure 3B:
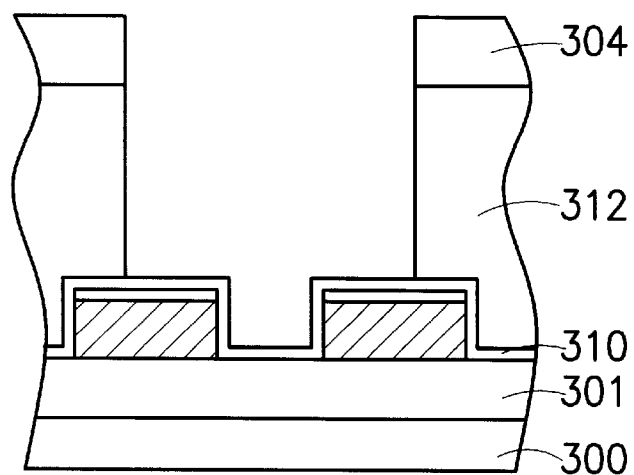

As shown in FIG. 3B, the second dielectric layer 312 is etched in a self-aligned contact manner using the photoresist layer 302 as a mask until the exposed second dielectric layer 312 is completely removed.

Figure 3C:
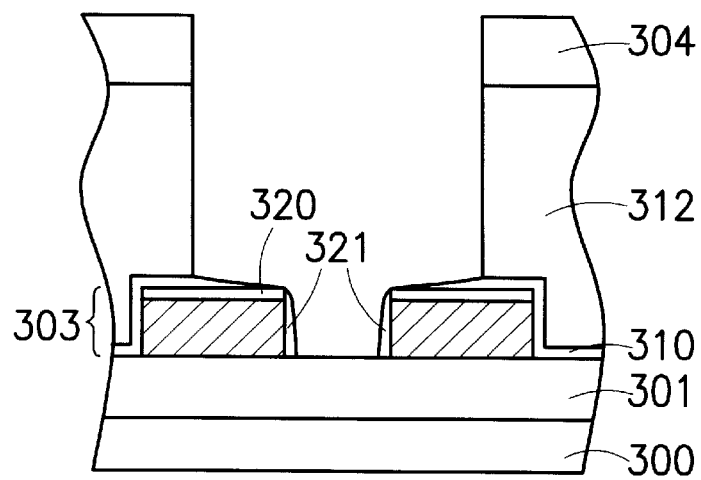

As shown in FIG. 3C, the etching process is continued using the photoresist layer 304 as a mask until the protective layer 310 is penetrated and the first dielectric layer 301 is exposed. Since all bit lines 303 have a protective cap layer 320 on top, the bit line 303 is well protected throughout the etching step. After the etching step, the protective layer 310 close to the sidewalls of the bit lines 303 is turned into spacers 321.

Figure 3D:
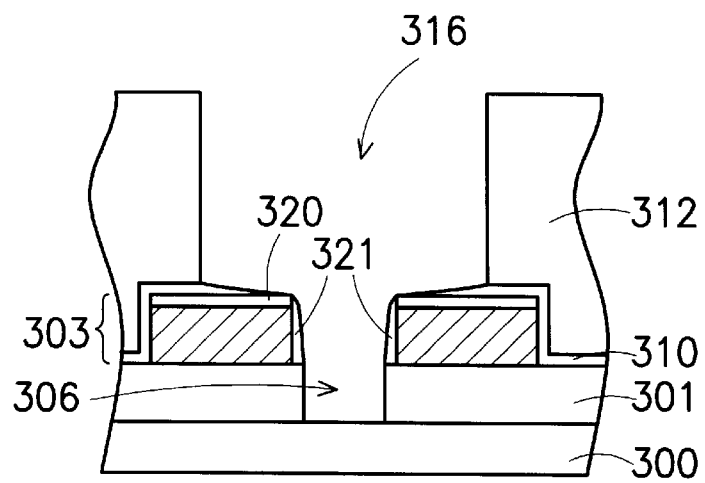

As shown in FIG. 3D, using the spacers 321, the cap layer 320 and the photoresist layer 304 as a mask, the exposed first dielectric layer 301 is etched. Ultimately, a node contact opening 306 and a lower electrode opening 316 are formed in the same step. The photoresist layer 304 is next removed. Since a self-aligned method is used, only a single photolithographic operation is required to form the contact opening 306 and the lower electrode opening 316. Moreover, the spacers 321 can serve as a guide for forming the node contact opening 306 during etching. Since the contact 306 is self-aligned relative to the bit lines 303, any misalignment of the node contact 306 can be avoided.

Figure 3E:
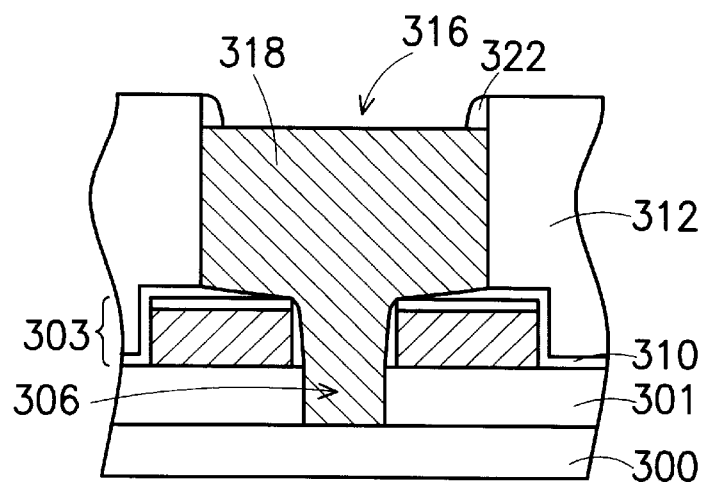

As shown in FIG. 3E, conductive material is deposited into the contact opening 306 and the lower electrode opening 316 to form a conductive layer 318. The upper surface of the conductive layer 318 remains below the opening 316. The conductive layer 318 can be a polysilicon layer formed, for example, by depositing polysilicon material into the contact opening 306, the electrode opening 316 and over the second dielectric layer 312 by chemical vapor deposition. The polysilicon layer is next anisotropically etched to remove excess polysilicon over the second dielectric layer 312 so that the upper surface of the polysilicon layer is below the opening 316. Spacers 322 are formed on the sidewalls of the opening 306 above the conductive layer 318. The spacers 322 can be a silicon nitride or a silicon oxide layer formed, for example, by depositing silicon nitride or silicon oxide over the conductive layer 318 and the second dielectric layer 312 by chemical vapor deposition. In the subsequent step, the silicon nitride or silicon oxide layer is etched back to form the spacers 322.

Figure 3F:
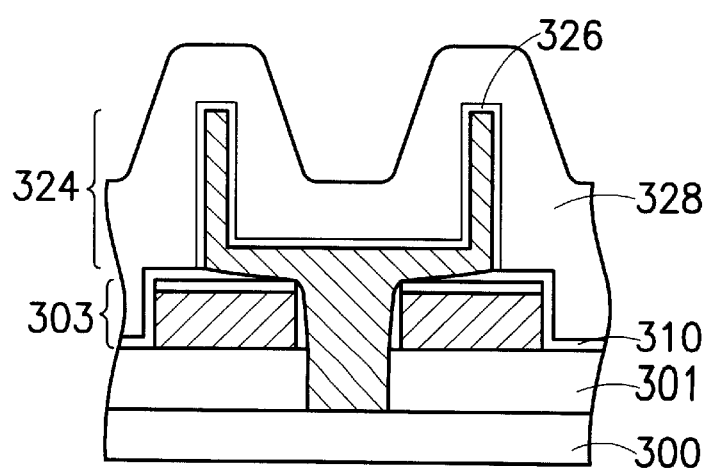

As shown in FIG. 3F, using the spacers 322 and the dielectric layer 312 as a mask, the conductive layer 318 is etched to form a lower electrode 324 having a recess groove therein above the node contact opening 306. The spacers 322 and the second dielectric layer 312 are removed to form the lower electrode of a DRAM cell. Another dielectric layer 326 is formed over the lower electrode and then an upper electrode 328 is formed over the dielectric layer 326.

In summary, major advantages of this invention include:
1. A single photomask is used to form the node contact opening and the lower electrode opening. Hence, the fabrication is less complicated and chance of contaminating the device is greatly reduced.
2. Self-aligned technique is used to form the contact opening. Since there is no need to worry about misalignment, a larger process window is permitted.
3. The capacitor and the bit line are isolated by the cap layer and the second dielectric layer. Hence, there is no need to form an exceptionally thick dielectric layer (over 8000 Å). Consequently, the spared space can be used to produce a capacitor with a larger effective surface area. Alternatively, for a capacitor having identical effective surface area, the additional space can be used to reduce the step height between the DRAM cell and peripheral circuits.

4. Because effective surface area is increased for a capacitor that occupies the same chip area, the level of device integration can be increased without diminishing the charge storage capacity of the capacitor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a dynamic random access memory cell, comprising the steps of:
    providing a substrate having a transistor thereon;
    forming a first dielectric layer over the substrate;
        forming a plurality of bit lines over the first dielectric layer, wherein each bit line has a cap layer on top;
        forming a protective layer over the first dielectric layer covering the bit lines;
    forming a second dielectric layer over the protective layer;
        etching the second dielectric layer in a self-aligned process, continuing the etching through the protective layer and the first dielectric layer until the substrate is exposed so that a node contact opening and a lower electrode opening for a capacitor are formed simultaneously;
        depositing conductive material into the node contact opening and the lower electrode opening to form a conductive layer, wherein an upper surface of the conductive layer is slightly below an upper end of the lower electrode opening;
        forming spacers on interior sidewalls of the lower electrode opening above the conductive layer;
        etching back the conductive layer using the spacers as a mask to form a lower electrode having a recess groove above the node contact opening;
    removing the second dielectric layer and the spacers;
    forming a third dielectric layer over the lower electrode; and
    forming an upper electrode over the third dielectric layer.

2. The method of claim 1, wherein the cap layer above the bit line is a material layer that can protect the bit line during the self-aligned etching step to form the node contact opening in the second dielectric layer.

3. The method of claim 1, wherein the self-aligned etching step for forming the node contact opening includes the sub-steps of:
    forming a photoresist layer over the second dielectric layer;
        etching the second dielectric layer using the photoresist layer as a mask until the protective layer is exposed;
        etching the protective layer using the photoresist layer as a mask until the first dielectric layer is exposed, thereby forming spacers on the sidewalls of the bit lines; and
        etching the first dielectric layer using the spacers as a mask until the substrate is exposed.

4. The method of claim 1, wherein the cap layer and the protective layer are made from materials having etching rates that differ considerably from the first dielectric layer and the second dielectric layer.

5. The method of claim 4, wherein material forming the cap layer and the protective layer includes silicon nitride.

6. The method of claim 1, wherein the protective layer has a thickness of about 300 Å.

7. The method of claim 1, wherein material forming the second dielectric layer includes silicon oxide.

8. The method of claim 1, wherein the second dielectric layer has a thickness about 8000 Å.

9. The method of claim 1, wherein the spacers are formed using a material that has an etching rate that differs from the conductive layer.

10. A method of manufacturing a dynamic random access memory cell, comprising the steps of:
    providing a substrate having a transistor thereon;
    forming a first dielectric layer over the substrate;
        forming a plurality of bit lines on the first dielectric layer, wherein each bit line has a cap layer on top;
        forming a protective layer over the first dielectric layer covering the bit lines;
    forming a second dielectric layer over the protective layer;
        etching the second dielectric layer in a self-aligned process, continuing the etching through the protective layer and the first dielectric layer until the substrate is exposed so that a node contact opening and a lower electrode opening for a capacitor are formed simultaneously; and
    depositing a conductive material into the node contact opening and the lower electrode opening to form a conductive layer, wherein the top surface of the conductive layer is slightly below the upper end of the lower electrode opening.

11. The method of claim 10, wherein the self-aligned etching step for forming the contact opening includes the sub-steps of:
    forming a photoresist layer over the second dielectric layer;
        etching the second dielectric layer using the photoresist layer as a mask until the protective layer is exposed;
        etching the protective layer using the photoresist layer as a mask until the first dielectric layer is exposed, thereby forming spacers on the sidewalls of the bit lines; and
        etching the first dielectric layer using the spacers as a mask until the substrate is exposed.

12. The method of claim 10, wherein after the step of depositing conductive material into the node contact opening and the lower electrode opening to form a conductive layer, further includes the steps of:
    forming spacers on the interior sidewalls of lower electrode opening above the conductive layer;
    etching back the conductive layer using the spacers as a mask to form a lower electrode having a recess groove above the node contact opening;
    removing the second dielectric layer and the spacers;
    forming a third dielectric layer over the lower electrode; and
    forming an upper electrode over the third dielectric layer.

13. The method of claim 10, wherein the cap layer above the bit line is a material layer that can protect the bit line during the self-aligned etching step to form the contact opening in the second dielectric layer.

14. The method of claim 10, wherein the cap layer and the protective layer are made from materials having etching rates that differ considerably from the first dielectric layer and the second dielectric layer.

15. The method of claim 14, wherein material forming the cap layer and the protective layer includes silicon nitride.

16. The method of claim 10, wherein the protective layer has a thickness of about 300 Å.

17. The method of claim 10, wherein material forming the second dielectric layer includes silicon oxide.

18. The method of claim 10, wherein the second dielectric layer has a thickness about 8000 Å.

* * * * *